United States Patent
Yilmaz et al.

(10) Patent No.: US 7,635,635 B2
(45) Date of Patent: Dec. 22, 2009

(54) METHOD FOR BONDING A SEMICONDUCTOR SUBSTRATE TO A METAL SUBSTRATE

(75) Inventors: Hamza Yilmaz, Saratoga, CA (US); Qi Wang, Sandy, UT (US); Minhua Li, Sandy, UT (US); Chung-Lin Wu, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 114 days.

(21) Appl. No.: 11/400,731

(22) Filed: Apr. 6, 2006

(65) Prior Publication Data

US 2007/0238263 A1 Oct. 11, 2007

(51) Int. Cl.
*H01L 21/46* (2006.01)
(52) U.S. Cl. .................. 438/455; 438/406; 438/464; 257/E21.088; 257/E21.51
(58) Field of Classification Search ......... 438/455–460; 257/296–304, E21.417–E21.42, E29.256–E29.261, 257/327–328, 339–342
See application file for complete search history.

(56) References Cited

U.S. PATENT DOCUMENTS

| | | | |
|---|---|---|---|
| 4,476,483 A * | 10/1984 | van de Ven et al. ......... | 257/753 |
| 4,536,783 A | 8/1985 | Miller et al. | |
| 4,613,558 A | 9/1986 | Nakagawa et al. | |
| 5,374,564 A | 12/1994 | Brule | |
| 5,578,841 A | 11/1996 | Vasquez et al. | |
| 5,643,821 A * | 7/1997 | Beasom ...................... | 438/355 |
| 5,825,090 A * | 10/1998 | Piccone ...................... | 257/747 |
| 6,392,290 B1 | 5/2002 | Kasem et al. | |
| 6,960,490 B2 | 11/2005 | Cunningham | |
| 7,256,501 B2 * | 8/2007 | Okamoto et al. ............ | 257/772 |
| 2004/0266603 A1 | 12/2004 | Fechner et al. | |
| 2005/0017291 A1 * | 1/2005 | Hirler ......................... | 257/328 |
| 2005/0161786 A1 * | 7/2005 | Zhuang ...................... | 257/678 |
| 2006/0066644 A1 | 3/2006 | Yamaguchi et al. | |
| 2006/0097391 A1 * | 5/2006 | Hata et al. .................. | 257/735 |
| 2006/0267088 A1 | 11/2006 | Sharp et al. | |

OTHER PUBLICATIONS

U.S. Appl. No. 11/189,163, Qi Wang, et al.
G.K. Celler and S. Cristoloveanu, Frontiers of Silicon-on-Insulator, Applied Physics Reviews-Focused Review, Journal of Applied Physics, vol. 93, No. 9, May 1, 2003, pp. 4955-4978.
M. Brule, Silicon on Insulator Material Technology, Electronic Letters, Jul. 6, 1995, vol. 31, No. 14, pp. 1201-1202.
Q.-Y. Tong and U. Gosele, Layer Transfer by Bonding and Layer Splitting, Semiconductor Wafer Bonding (Science and Technology), The Electrochemical Society Series, 1999, pp. 161-165.

(Continued)

*Primary Examiner*—Ha Tran T Nguyen
*Assistant Examiner*—Daniel Whalen
(74) *Attorney, Agent, or Firm*—Townsend and Townsend and Crew LLP

(57) ABSTRACT

A method of bonding a semiconductor substrate to a metal substrate is disclosed. In some embodiments the method includes forming a semiconductor device in a semiconductor substrate, the semiconductor device comprising a first surface. The method further includes obtaining a metal substrate. The metal substrate is bonded to the first surface of the semiconductor device, wherein at least a portion of the metal substrate forms an electrical terminal for the semiconductor device.

22 Claims, 8 Drawing Sheets

OTHER PUBLICATIONS

Q.-Y. Tong, K. Gutjahr, S. Hopfe, and U. Gosele, Layer Splitting Process in Hydrogen-Implanted Si, Ge, SiC, and Diamond Substrates, Appl. Phys Lett. 70(11), Mar. 17, 1997, pp. 1390-1392.

International Search Report, PCT/US07/63807, Mail Date Feb. 14, 2008, 1p.

* cited by examiner

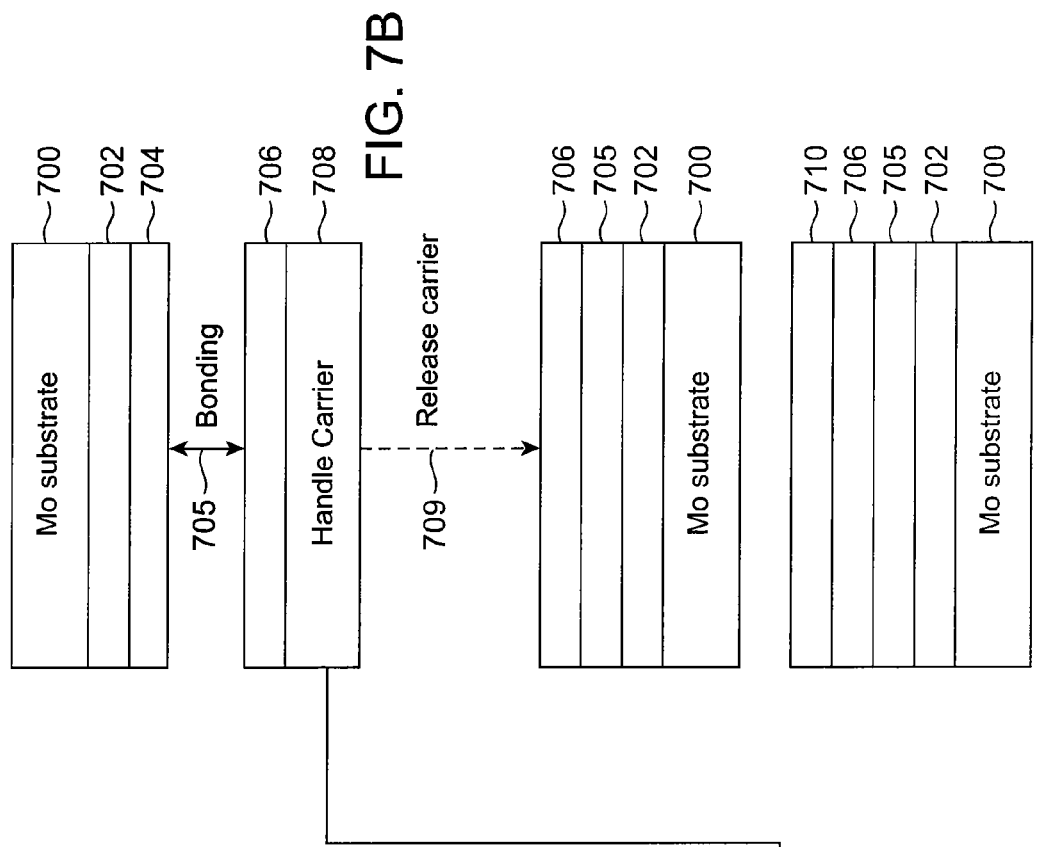
FIG. 7B
FIG. 7C
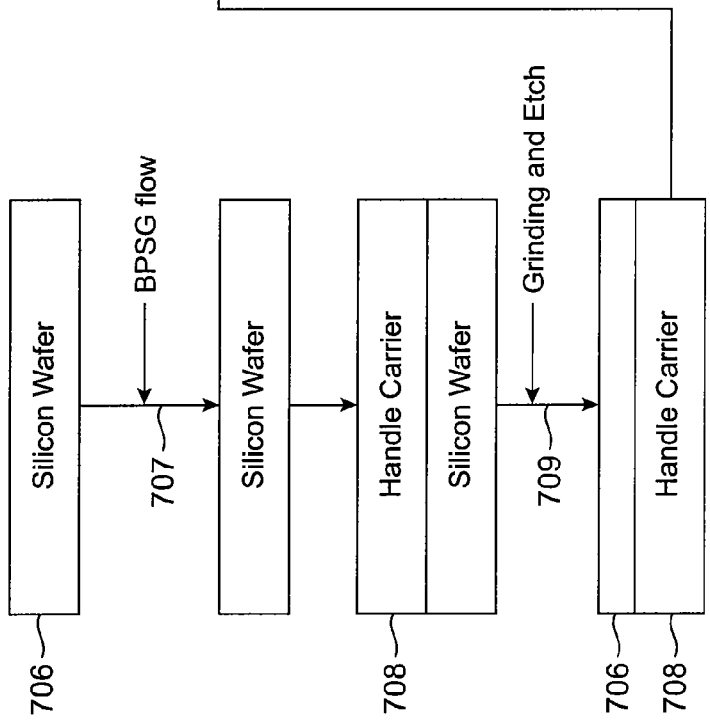
FIG. 7A

METHOD FOR BONDING A SEMICONDUCTOR SUBSTRATE TO A METAL SUBSTRATE

BACKGROUND OF THE INVENTION

Conventional semiconductor manufacturing uses a number of processes to form semiconductor devices in substrates. The substrate can be a wafer, which is a small, thin, circular slice of a semiconducting material, such as silicon Semiconductor devices formed on the substrate may be discrete devices or integrated circuits. For example, the semiconductor devices may be composed of a single discrete power transistor, or may be formed from a number of transistors and other electronic elements, such as resistors, capacitors, etc., that are electrically coupled together to form an integrated circuit. After the formation of the semiconductor devices, the wafer is tested and diced to separate individual dies in the wafer.

As explained in U.S. patent application Ser. No. 11/189,163, by providing smaller dimensions in semiconductor devices and substrates, properties such as resistance, power dissipation, and parasitic impedance are reduced. In particular, thinning the silicon substrate after device fabrication reduces the on-resistance and the parasitic delay of modern low voltage rating DMOS and IGBT devices, respectively. In conventional semiconductor device fabrication processes, after the devices, other semiconductor layers, and metal layers have been formed, the substrate is often thinned by a process such as mechanical grinding or chemical mechanical polishing (CMP). Recent process developments have resulted in a final silicon substrate thinner than 100 μm.

However, there are a number of problems associated with processing the silicon substrate. For example, since the substrate is thin, it may warp or break at the stage of drain metallization, or at subsequent stages of wafer handling in a power MOSFET manufacturing process. The drain metallization process described in U.S. application Ser. No. 11/189,163 uses sputtering and evaporation During the stage of formation of the drain electrode, the stress and heat caused by conventional drain metallization methods such as sputtering or evaporation may lead to severe amounts of wafer warpage or breakage. And even if the wafers survive the drain formation process, ultra-thin wafers are susceptible to higher handling-related breakage.

Embodiments of the invention address the above problems and other problems individually and collectively.

BRIEF SUMMARY OF THE INVENTION

Embodiments of the invention are directed to semiconductor devices formed on semiconductor substrates, methods for forming semiconductor devices on semiconductor substrates and methods for transferring semiconductor devices formed on semiconductor substrates to metal substrates. Some embodiments of the invention are directed to MOSFET devices. However, embodiments of the invention can be extended to other types of semiconductor devices as well.

One embodiment of the invention is directed to a method of bonding a semiconductor substrate to a metal substrate. The method includes forming a semiconductor device in a semiconductor substrate, the semiconductor device comprising a first surface. The method further includes obtaining a metal substrate. The method further includes bonding the metal substrate to the first surface of the semiconductor device, wherein at least a portion of the metal substrate forms an electrical terminal for the semiconductor device.

Another embodiment of the invention is directed to a semiconductor chip. The semiconductor chip includes a semiconductor die having a semiconductor device and a thickness of about 100 μm or less. The semiconductor chip also includes an interlayer. The semiconductor chip also includes a metal substrate, wherein the interlayer is between the metal substrate and the semiconductor die, and at least a portion of the metal substrate forms an electrical terminal.

Another embodiment of the invention is directed to a semiconductor chip. The semiconductor chip includes a semiconductor die having a semiconductor device. The semiconductor chip also includes an interlayer. The semiconductor chip also includes a metal substrate, wherein the interlayer is between the metal substrate and the semiconductor die, the metal substrate has a CTE of less than about $5 \times 10^{-6}$ °C.$^{-1}$ at about 200°, and at least a portion of the metal substrate forms an electrical terminal.

BRIEF DESCRIPTION OF THE DRAWINGS

FIG. 7A shows a simplified cross sectional view of a silicon wafer adhered to temporary carrier, according to an embodiment of the invention.

FIG. 7B shows a silicon wafer transferred to a metal-poly-molybdenum stack, according to an embodiment of the invention.

FIG. 7C shows a simplified cross sectional view of a silicon wafer bonded to a poly-molybdenum stack by a silicide layer, according to an embodiment of the invention.

DETAILED DESCRIPTION OF THE INVENTION

Embodiments of the present invention address the above problems and other problems, such as warpage or handling-related breakage of the silicon wafer, by providing a method for transferring a processed and thinned silicon to a prefabricated metal substrate. The metal substrate, or a portion thereof, can serve as both an electrical terminal (i.e., a drain electrode) for devices formed in the silicon wafer and a mechanical support for the silicon wafer. According to a preferred embodiment of the invention, the metal substrate has a thermal coefficient of expansion that substantially matches that of the silicon. According to a preferred embodiment of the invention, an interlayer is also formed over the metal substrate to enable a low temperature and low stress process to bond the metal to the silicon wafer.

This process eliminates various problems of device operation, such as silicons contribution to the on-resistance in conventional DMOS devices and the parasitic delay in IGBT devices. Other advantages also provided by some embodiments include the elimination of the conventional back-metal formation processes. Eliminating conventional back-metal formation processes significantly reduces the chance that the wafer will break during the process and also avoids the wafer's exposure to the high temperatures of the previously described drain metallization processes. Drain metallization processes include sputtering and evaporation, which occur at around 300° C. The thick, supporting metal substrate also reduces the chance of a silicon wafer's handling-related breakage in the fabrication process, after the silicon wafer is thinned to a thickness of less than 100 μm.

Figure 1B:
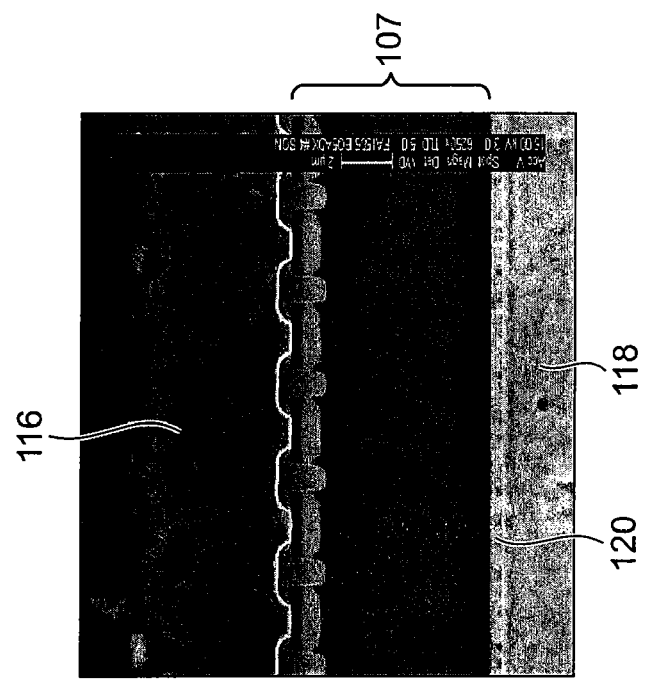
FIG. 1B shows a cross sectional view of a power MOSFET according to an embodiment of the invention.
Figure 1A:
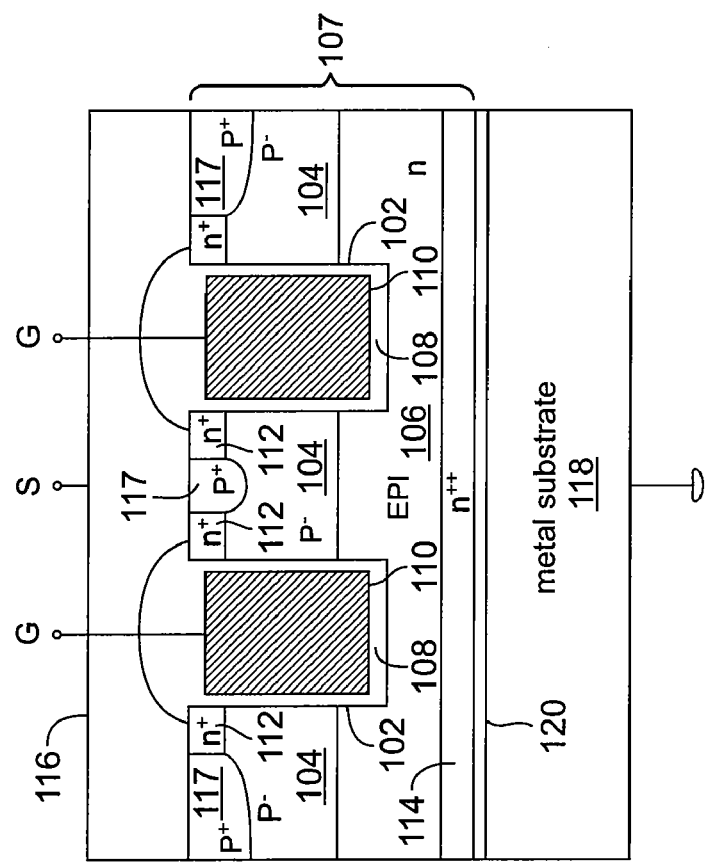
FIG. 1A shows a cross sectional view of a power MOSFET according to an embodiment of the invention.

The semiconductor devices that can be formed in the wafer may be vertical devices such as power MOSFETs, IGBTs, diodes, etc. Embodiments of the invention will be described in greater detail in the context of a vertical power MOSFET for simplicity, as shown in FIGS. 1A and 1B. However, the invention is not limited to the vertical power MOSFET. Various conventional power devices, including other trenched devices as well as planar devices can benefit from embodiments of the invention to eliminate the metallization process of forming the back-metal electrode or electrical terminal. As with all the other figures described herein, the relative dimensions and sizes of the elements shown do not necessarily reflect actual dimensions and are for illustrative purposes only.

FIG. 1A shows a cross sectional view of a trenched gated MOSFET with a metal substrate 118 as the drain electrode. A silicon substrate according to an embodiment of the invention is shown by the combination of semiconducting layers 107. The top metal layer 116 is the electrical contact for the source regions 112 and body regions 117. A p-type region 104 is formed over n-type epitaxial layers 106 and 114. An interlayer 120 bonds the entire semiconductor substrate 107 to the metal substrate 118. FIG. 1B shows an SEM that corresponds to the cross sectional schematic of FIG. 1A. The thinned silicon substrate 107 measures a total width of about 8 μm.

A silicon wafer can include an array of semiconductor dies with semiconductor devices, such as the MOSFET shown in FIG. 1A. After the silicon wafer is bonded to the metal substrate that provides the drain electrode for the semiconductor devices in the silicon wafer, the silicon wafer and metal substrate combination is then diced to form individual semiconductor chips. Each semiconductor die includes the semiconductor substrate 107 and the metal substrate 118 shown in FIG. 1. Thus, as used herein, the term "metal substrate" can refer to a substrate that is bonded to a wafer with many silicon dies, or a substrate that is attached to a single die.

Figure 2A:
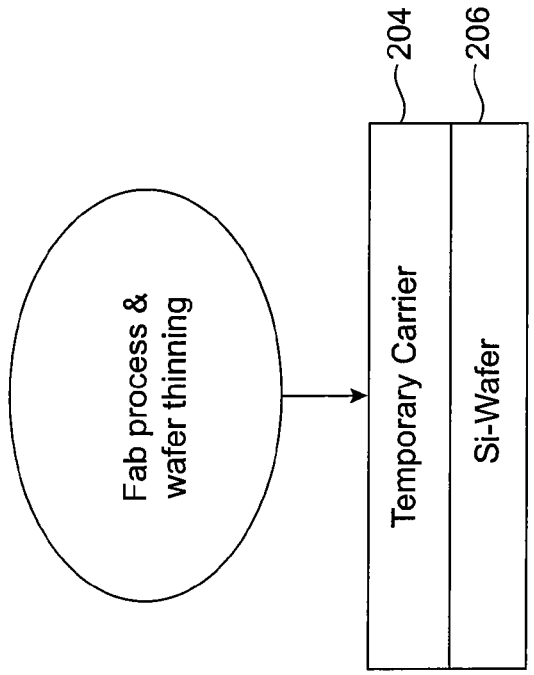
FIG. 2A shows a simplified cross sectional view of an interlayer formed over a metal substrate that is thermally matched to a silicon wafer, according to an embodiment of the invention.
Figure 2B:
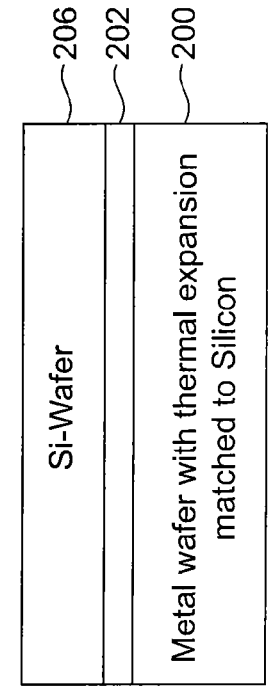
FIG. 2B shows a simplified cross sectional view of a silicon wafer adhered to a temporary carrier, according to an embodiment of the invention.

FIGS. 2A-2D show an exemplary process of transferring the silicon wafer to the metal substrate according to one embodiment of the invention. A metal substrate 200 is first chosen for its properties. One property to consider is that the coefficient of thermal expansion of the metal substantially matches that of the silicon. Matching the thermal expansion properties between the two substrates eliminates the thermal stress and thus the possibility of the semiconductor die detaching from the silicon wafer or silicon yield. The metal is machined into a wafer shape with a diameter of 6" and a thickness of about 200 μm FIG. 2A shows an interlayer 202 formed on the surface of the metal wafer 200, after the metal wafer is formed. The interlayer 202 can be formed by any film deposition process, provided that it has low interfacial energies with both the metal and silicon substrates prior to bonding. Suitable methods for forming the interlayer 202 are discussed below. In addition to forming strong interfacial bonds with metal wafer 200, interlayer 202 also forms good electrical and mechanical contacts at low temperatures (<300° C.) to the silicon wafer. After the formation of interlayer 202 over the metal substrate, the interlayer and metal combination is ready to be bonded to the processed silicon wafer.

Figure 2C:
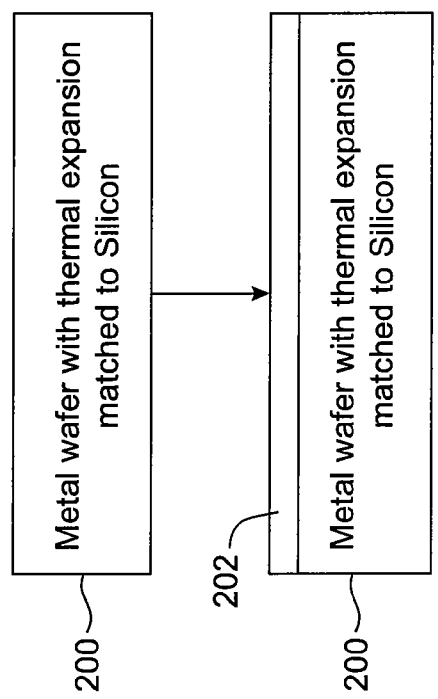
FIG. 2C shows a simplified cross sectional view of a temporary carrier and a silicon wafer bonded to an interlayer formed over a metal wafer, according to an embodiment of the invention.
Figure 2D:
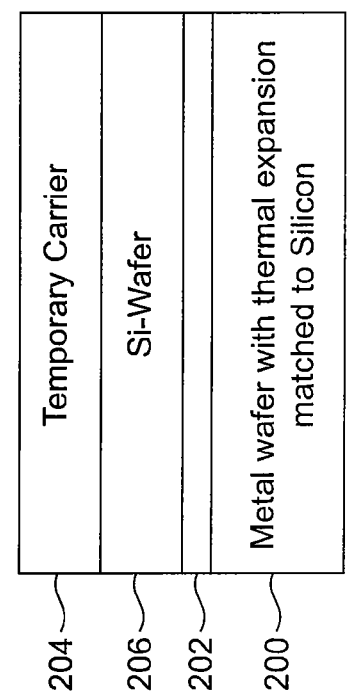
FIG. 2D shows a simplified cross sectional view of a silicon wafer bonded to an interlayer formed over a metal wafer, according to an embodiment of the invention.

FIG. 2D shows the silicon wafer or substrate 206 after it is processed with semiconductor devices and thinned. Because the thickness of silicon wafer 206 is less than 100 μm in some cases, the processed silicon wafer has a temporary handle or carrier 204 bonded or adhered to the wafer's front side. As shown in FIG. 2C, carrier 204 delivers the silicon wafer 206 to the combination of metal substrate 200 and interlayer 202. After the process of bonding the metal to the silicon wafer, the front-side carrier 204 is released. FIG. 2D shows the subsequent thinned silicon layer 206 with semiconductor devices transferred to the 200 μm metal substrate 200.

Some considerations for this above process are the selections of the metal, the interlayer, and the bonding process. All three will be discussed in further detail below.

A. Thermally Matched Metal Substrate

The thermal stress generated due to the mismatch of linear coefficients of thermal expansion (CTE) between the silicon and metal substrates will have an impact on the deformation of the silicon or the detaching of the die on the silicon wafer. This impact is more pronounced when the silicon layer is reduced to a thickness of less than 100 μm. It is thus desirable to match the CTE of the metal wafer to the CTE of silicon to integrate embodiments of the invention into existing technologies.

To avoid the semiconductor die detach or fracture of the silicon layer, the thermal stress produced by the mismatch of the CTE is smaller than either (1) the silicon yield strength or (2) the strength of the interface between the silicon wafer and the interlayer (referred as "interface strength" hereafter), whichever is smaller. In the case where the interface strength is greater than silicon yield strength, the silicon will have the chance to fracture first. In the case where the silicon yield strength is greater than the interface strength, the semiconductor die may detach before the silicon fractures.

1. Interface Strength is Greater than the Silicon Yield Strength

For the first case in which the interface strength is greater than the silicon yield strength, the CTE of the metal for certain temperatures (either operating or processing temperatures) follows Equation 1 below to avoid any silicon layer yield:

$$\alpha_{metal} \leq \alpha_{Si} + \frac{\gamma_{Si}^{yield}}{(T_1 - T_o)G_{Si}} \alpha_{metal} \qquad \text{Equation 1}$$

where $T_1$ and $T_0$ are operating or processing and ambient temperatures, respectively; $G_{Si}$ is the shear modulus of silicon; $\alpha_{metal}$ and $\alpha_{Si}$ are the CTE's of the metal substrate and silicon, respectively. The $\gamma$ is the yield strength of silicon.

Figure 3:
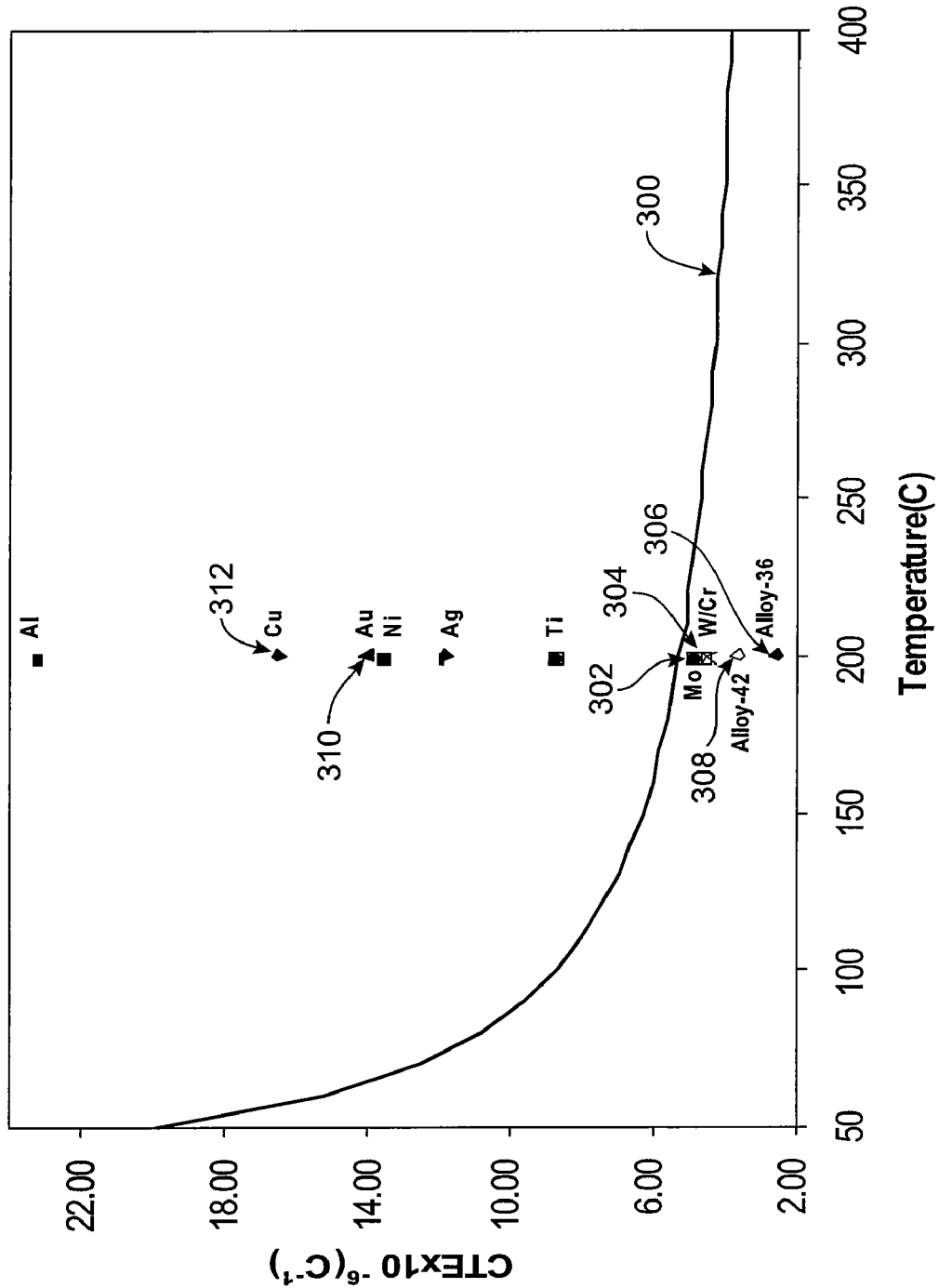
FIG. 3 shows a graph of the desired coefficient of thermal expansion vs. temperature. The coefficients of thermal expansion for various metals are also shown.

FIG. 3 shows a plot 300 of the maximum CTE of the metal substrate allowed before the silicon fractures. For comparison, the CTE's of various metals at different operating temperatures are also displayed in FIG. 3. The values for silicon used were $\alpha_{Si}=2.6\times10^{-6\circ}$ C.$^{-1}$, $G_{Si}=64.1$ GPa, and $\gamma=30$ MPa, which are typical values for a Czochralski silicon wafer with an interstitial oxygen level of $7\times10^{-1}$ cm$^{-3}$. The metals plotted in the graph of FIG. 3 include the most commonly used metals and alloys in the semiconductor industry. For simplicity, the CTE's of the metals plotted were assumed constant within the temperature range of interest.

Figure 4:
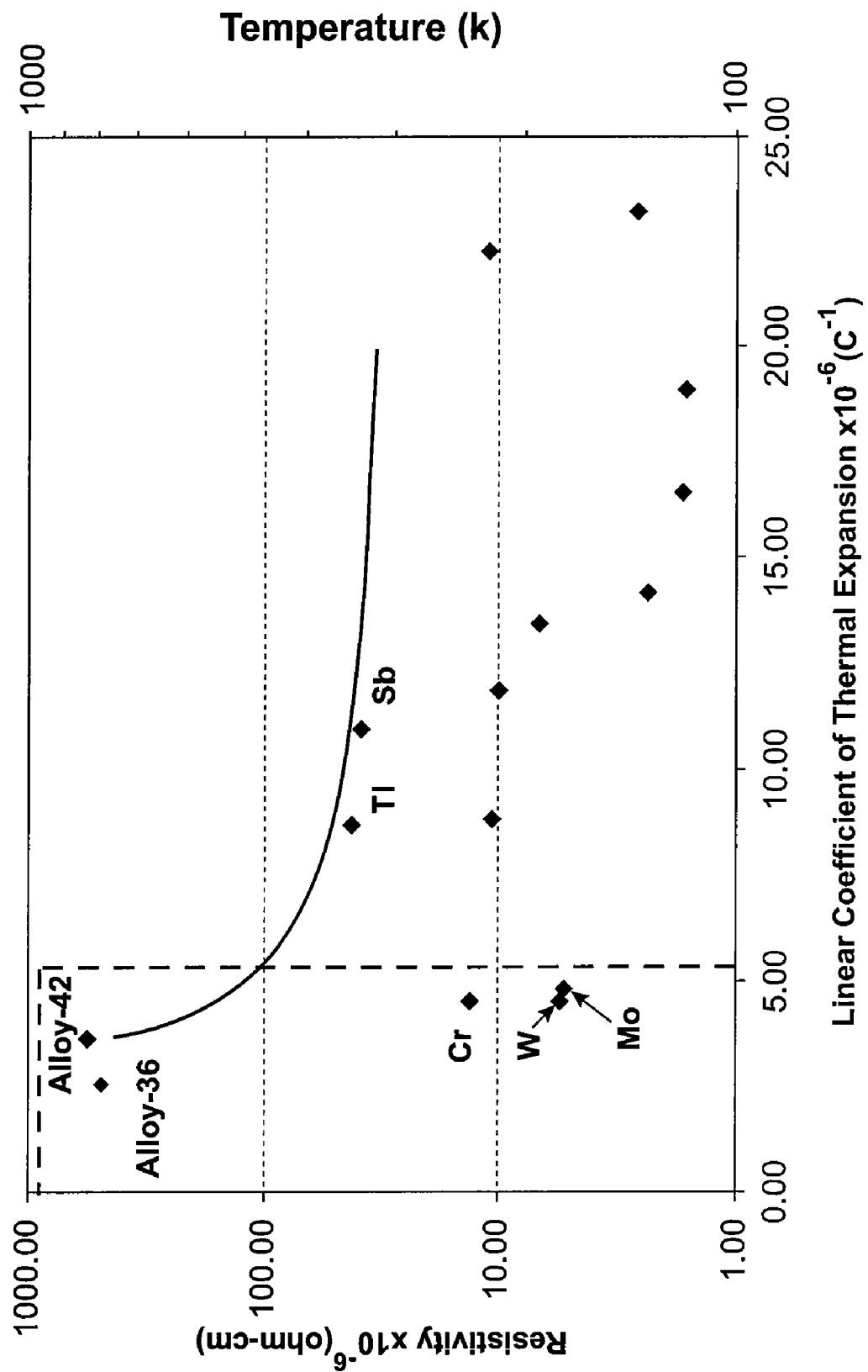
FIG. 4 shows a graph of the coefficient of thermal expansion and resistivity vs. temperature for various metals. The solid curve is the coefficient matching Si.

FIG. 3 shows that for the operating temperature of 200° C., a metal's CTE is less than $5\times10^{-6\circ}$ C.$^{-1}$ to satisfy the relationship to silicon's fracture given above at Equation 1. Some of the metals plotted and found to meet this requirement include refractory metals such as molybdenum (Mo), tungsten (W), and chromium (Cr), as shown at points 302 and 304. There are some Ni—Fe alloys that were also found to satisfy the requirement, such as Ni$_{36}$Fe, as shown in 306, and Ni$_{42}$Fe, as shown in 308. FIG. 3 also shows that Al and Cu, the most commonly used metals in the industry, have the largest CTE mismatch to silicon. Such a high thermal mismatch may generate severe thermal stresses and fracture in thin silicon substrates. The alloy Ni$_{36}$Fe has almost the same CTE as silicon's. However, as shown at 406 in FIG. 4, its resistivity is about 0.495 mΩ-cm, which is only five times less than arsenic-doped silicon. On the other hand, the Mo which also satisfies the CTE requirement has a resistivity of 5.3 µΩ-cm, as shown at 402 in FIG. 4. In general, metal substrates having a CTE of less than about $5\times10^{-6\circ}$ C.$^{-1}$ at about 200° C. can be used in embodiments of the invention.

Figure 5B:
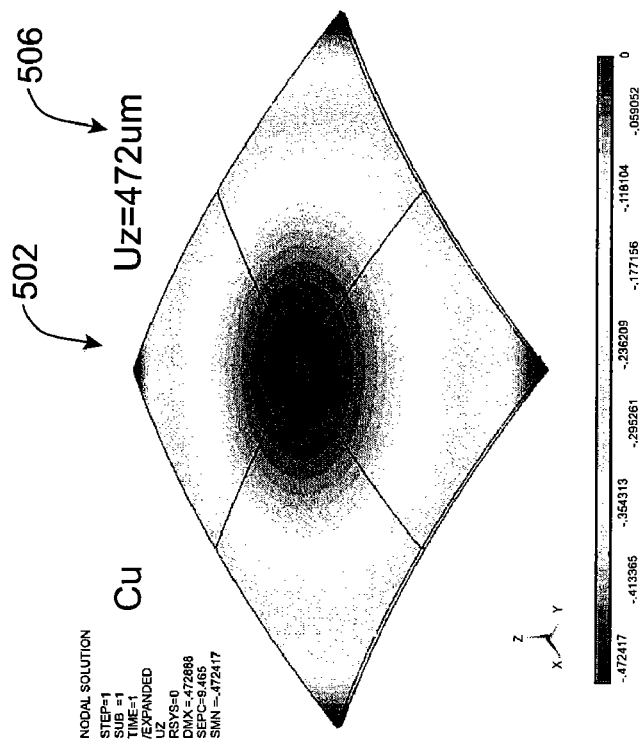
FIG. 5B shows a 3D plot of the wafer warpage for copper.
Figure 5A:
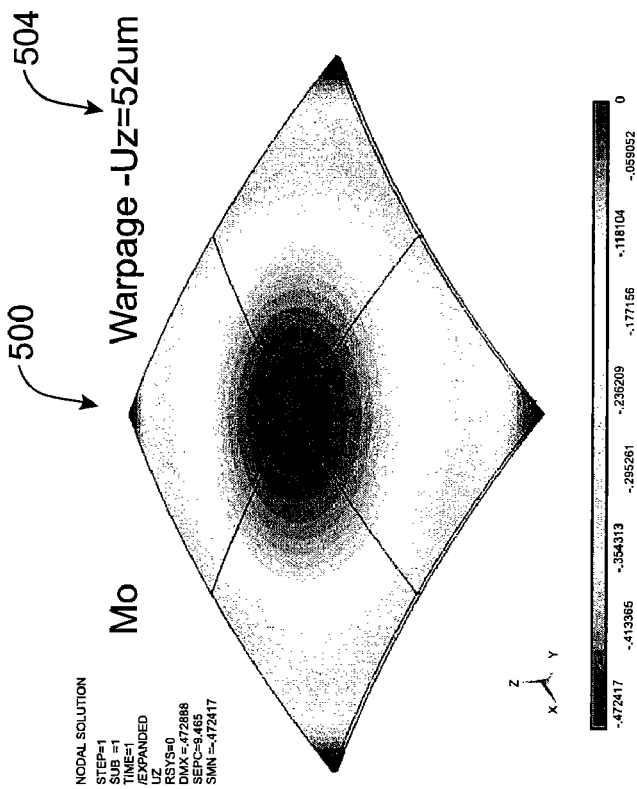
FIG. 5A shows a 3D plot of the wafer warpage for molybdenum.

FIGS. 5A and 5B show the finite element analysis simulations of the warpage due to thermal stress for silicon/metal composites. In the simulations, Mo was compared to Cu since Cu is a desirable metal of choice for its wide use in semiconductor fabrication. The sample size of the simulations was 10 mm×10 mm. The thermal loading is a cool down in temperature from 150° C. to −65° C. A 15 µm silicon substrate is laminated to 101.6 µm of Mo and 101.6 µm of Cu. The 3D results for Mo are shown at 500 in FIG. 5A, and the results for Cu are shown at 502 in FIG. 5B.

The simulations show that when replacing the commonly used Cu with Mo, the warpage of the Si/Metal composite is reduced by 90% and the Von-Mises stress is reduced by about 82%. For example, the warpage for Mo gives a value of 52 µm as shown at 504 in FIG. 5A and for Cu a value of 472 µm as shown at 506 in FIG. 5B. Simulations have also shown that increasing the thickness of the Mo will reduce the warpage of the wafer, but also increase the composite stress as a trade-off Balancing the results of warpage and stress suggested a thickness of 150 µm of the Mo layer for a thickness of 15 µM of silicon. However, the choice and thickness of metal may vary depending on the application, or a particular device's thermal and on-resistance requirements.

2. Silicon Yield Strength is Greater Than Interface Strength

In the case of a weaker interface strength between the silicon wafer and the interlayer, the die may detach from the interlayer before the silicon deforms. The above analysis is still valid for this case, except that both γ and G are replaced by the interfacial strength and shear modulus. These values depend on the interlayer material and the bonding process Thus, an interlayer with low interfacial energies with the silicon and metal substrates should be properly chosen to give a high interface strength.

B. Interlayer Selection

As noted above, one function of the interlayer 202 shown in FIGS. 2A-2D is to enable strong bonding or interfacial adhesion to the silicon wafer at low temperatures. In order to enable strong bonding or adhesion to the silicon wafer it is desirable that the material for the interlayer has a low interfacial energy with silicon. Another function of the interlayer is to provide good adhesion to the thermally matched metal substrate. A typical thickness value for the interlayer lies in the range of about 1-5 µm according to embodiments of the invention. However, the thickness may also be considerably larger, so long as it does not contribute to the overall stress and warpage of the wafer.

According to a preferred embodiment of the invention, an amorphous silicon film is used as the interlayer. According to another embodiment of the invention a poly-silicon film is used. An amorphous or poly-silicon film can be deposited onto a metal wafer such as a Mo substrate. Additional annealing may be performed to ensure a strong interface between the Mo substrate and the amorphous or poly-silicon interlayer. Bonding the structure of poly-over-Mo to the processed silicon wafer is then reduced to bonding two similar materials, resulting in strong adhesion of the underlying metal substrate to the processed silicon. In principle, this result can be achieved with a fairly low thermal budget.

Figure 6A:
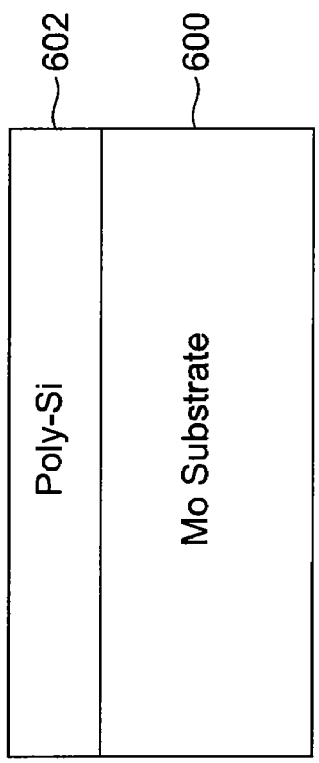
FIG. 6A shows a simplified cross sectional view of a poly-silicon layer formed over a molybdenum substrate, according to an embodiment of the invention.
Figure 6C:
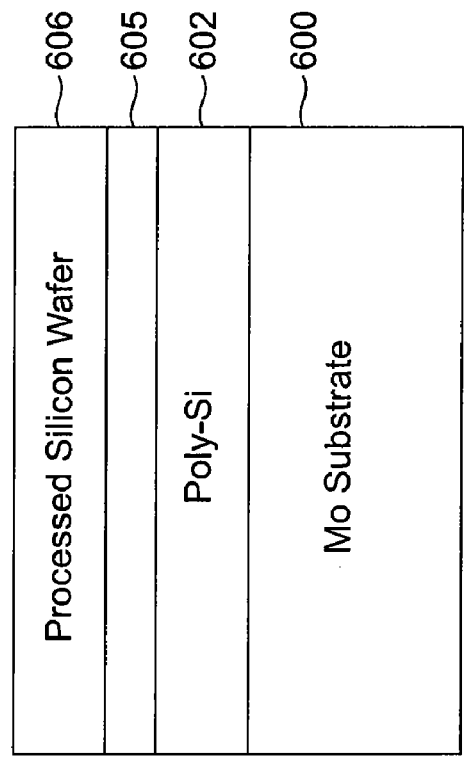
FIG. 6C shows a simplified cross sectional view of a processed silicon wafer bonded to a silicide-poly-molybdenum stack, according to an embodiment of the invention.
Figure 6B:
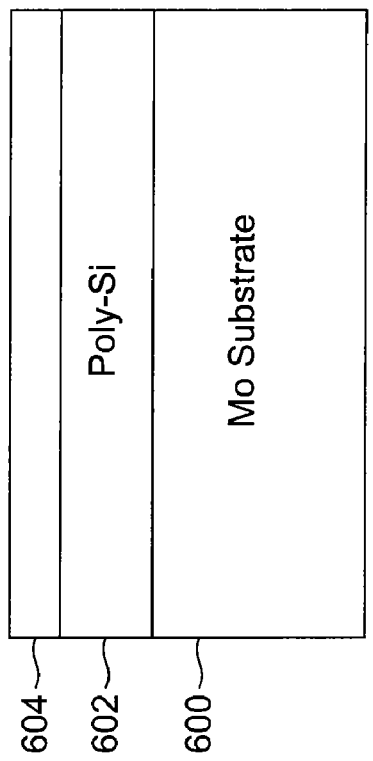
FIG. 6B shows a simplified cross sectional view of a silicide metal layer formed over a poly-molybdenum stack, according to an embodiment of the invention.

According to another embodiment of the invention, a silicide process can be incorporated. Forming a silicide can enhance the bonding of the wafers by requiring lower temperatures and resulting in lower overall stress. FIGS. 6A-6C show the process flow for a silicide process according to this embodiment. FIG. 6A shows a poly-silicon film 602 deposited onto a metal wafer such as the Mo substrate 600.

In the step of FIG. 6B, a metal layer 604, which can include Ti, Pt, W, or Co, is deposited directly above the Mo substrate or above the poly-silicon film 602. The silicide metal may be formed by depositing the metal over the inter-layer by a low temperature chemical vapor deposition (CVD) or sputtering process. In some embodiments, a nucleation layer may first be formed over the poly-silicon before the silicide is formed. The nucleation effects are reduced when the silicide is formed on an amorphous layer, and accordingly a poly-silicon interlayer may be more appropriate for such embodiments. Embodiments of the invention may also use epitaxial silicides, as an alternative to polycrystalline silicides. An epitaxial silicide shows a definite orientation relationship with respect to the silicon on which it is formed, and is expected to grow epitaxially on silicon if the crystal structures are similar and the lattice mismatch between them is small.

The step in FIG. 6C shows that the processed and thinned silicon wafer or substrate 606 is placed on the structure of metal-over-poly-over-Mo. A thermal process is then typically performed to allow the metal layer 604 to react with the silicon wafer 606 to form the silicide layer 605 The resulting silicide generates both good mechanical and electrical contacts between the silicon wafer 606 and the underlying metal 604 with the poly-silicon 602 formed over.

Criteria for the selection of the silicide metal 604 include low silicide formation temperature and low stress. A low silicide formation temperature and low stress are desirable to minimize the thermal budget required for good bonding strength with the silicon wafer. The thickness of the silicide metal is also a consideration for a particularly desired silicide concentration.

According to other embodiments of the invention, various alternatives may be used for the interlayer. For example, an Epoxy-Ag material as used in packaging technology may be used instead. Use of the Epoxy-Ag is a fairly simple process that does not require bonding and only requires the processing temperature to cure the Epoxy. Another alternative is to use a Sn—Ag—Cu alloy, a material currently used in eutectic package technology. The eutectic composition is 3.5wt % Ag, 0.9 wt % Cu and Sn in balance. Using this interlayer can enable the metal and silicon wafers to be bonded at 217.2° C., which is the eutectic temperature.

C. Wafer Bonding Process

A third consideration for embodiments of the invention is the process of bonding the silicon wafer to the metal substrate. The selection of the bonding process depends on the choice of the interlayer material. In preferred embodiments of the invention, the bonding process typically is a thermal process. However, the bonding process is not so limited and other processes may be used.

One advantage that embodiments of the invention provide is that if the metal substrate which may eventually form a drain terminal is formed at the level of semiconductor processing, it can provide mechanical support to the very thin silicon wafer throughout the remainder of the process steps. For example, in one embodiment of the invention, the formation of the top source metal for the semiconductor device in the silicon wafer is postponed until after the silicon wafer is bonded to metal substrate. FIGS. 7A-7C illustrate this process flow according to this embodiment FIG. 7A shows the silicon wafer 706 being processed throughout fabrication, until the BPSG film at 707 is deposited and flowed over the top surface of the device, and before the top source metal layer is formed.

Silicon wafer 706 is then bonded or adhered to a temporary glass handle or carrier 708. In one embodiment of the invention, the temporary carrier is adhered to the silicon wafer by an adhesive such as a polyimide tape that is curable by UV energy. Various tapes can provide adhesive properties at temperatures that are as low as 50° C., while others may require temperatures as high as 300° C. In yet another embodiment of the invention, the adhesive material itself such as a polyimide layer may itself serve as the carrier. Once the silicon wafer 706 is bonded or adhered to temporary carrier 708, the silicon wafer 706 is thinned to a desired thickness at step 709. The thinning process may include conventional grinding and etching processes.

FIG. 7B shows that silicon wafer 706 still adhered to the carrier 708 is transferred and bonded at the bonding step 705 to a Mo/poly/metal stack. The stack includes Mo substrate 700, poly-silicon film 702 and silicide metal 704. Since there is no metal at the front side of the silicon wafer 706 (where there is a handle carrier 708 attached instead), and Mo has a low vapor pressure and negligible diffusivity in silicon, the bonding process according to this embodiment can afford a relative high thermal budget to ensure good bonding strength. The process of FIGS. 7A-7C can expose the front side material to the wafer processing temperatures as high as 450° C.

FIG. 7B further shows that after silicon wafer 706 is transferred, it is released from carrier 708. A silicide 705 is formed between the Mo-poly stack and silicon wafer 706. At FIG. 7C, after carrier 708 is released, the Mo/poly/metal stack that is bonded to the silicon wafer 706 is subsequently processed to form the front side metal contact. The front side source metal 710 is then formed at the surface to which carrier 708 was previously bonded. Additionally, the thermal process is conducted in an inert ambient to prevent oxidation from occurring, according to another embodiment of the invention.

Figure 7D:
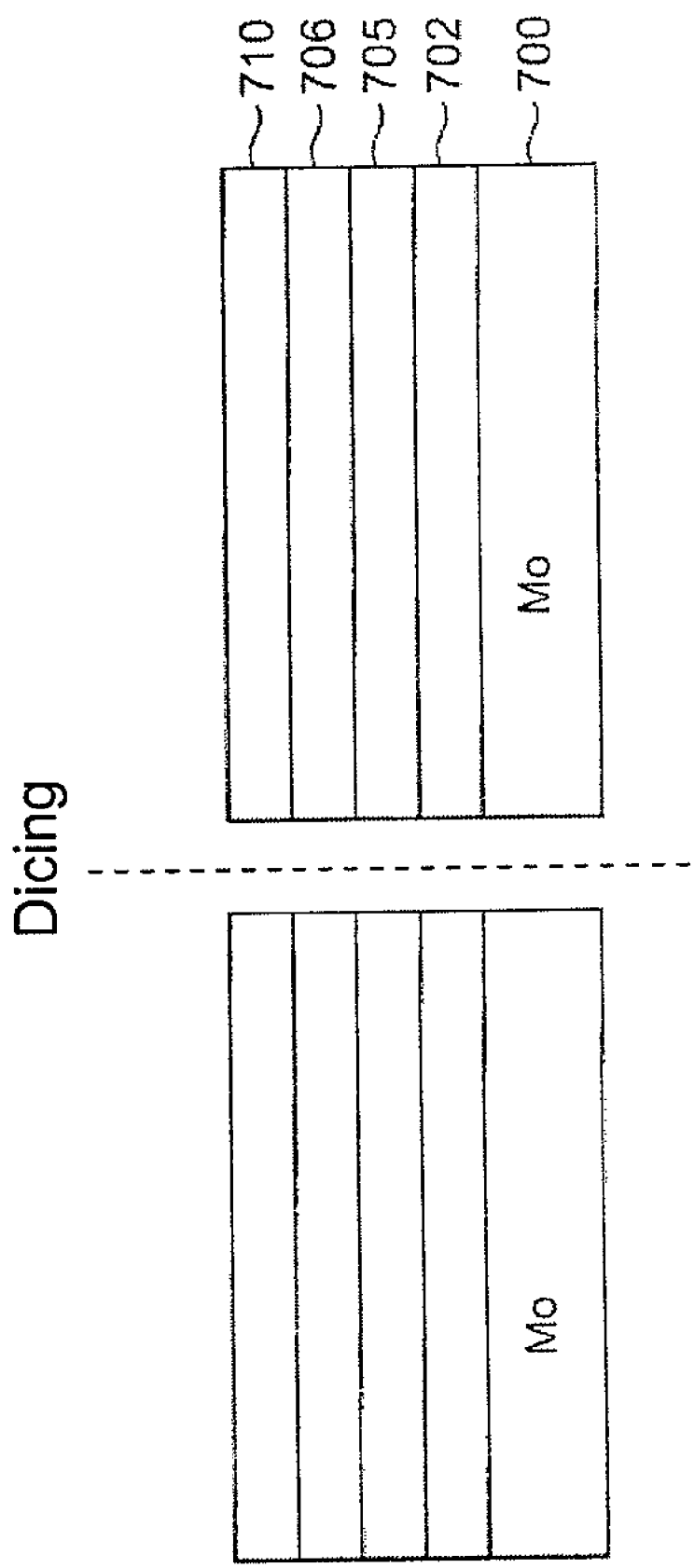
FIG. 7D shows a simplified cross sectional view of the dicing of a silicon wafer bonded to a poly-molybdenum stack by a silicide layer, according to an embodiment of the invention.

Then, the combination shown in FIG. 7C is diced to form individual semiconductor chips as shown in FIG. 7D. Each chip may have a source, gate and drain, if it contains a vertical MOSFET. The chips may be packaged according to conventional packaging processes.

Although a number of specific embodiments are shown and described above, the invention is not limited to them. For example, additional layers may be formed in the semiconductor-metal stack to enhance interfacial bonding, or the electrical, mechanical or other properties of the device. Other alternatives, modifications and equivalents may be used and any one or more features of any embodiment of the invention may be combined with any one or more other features of any other embodiment of the invention, without departing from the scope of the invention.

The above-described embodiments of the invention can also be used in any suitable electrical assembly including wireless phones, personal computers, servers, television sets, radios, etc.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents. Moreover, one or more features from any embodiment may be combined with one or more features of any other embodiment without departing from the scope of the invention.

A recitation of "a", "an" or "the" is intended to mean "one or more" unless specifically indicated to the contrary. In addition, words such as "over", "under", etc. are used to described features as they are shown in the Figures and may or may not refer to absolute positions when the semiconductor die packages according to embodiments of the invention are made or used.

All patents, patent applications, publications, and descriptions mentioned above are herein incorporated by reference in their entirety for all purposes. None is admitted to be prior art.

What is claimed is:

1. A method of bonding a semiconductor substrate to a metal substrate comprising:

forming a semiconductor device in a semiconductor substrate, the semiconductor device comprising a first surface;

obtaining a metal substrate, wherein the metal substrate is thermally matched to the semiconductor substrate;

forming an interlayer on the metal substrate, wherein the interlayer comprises an amorphous silicon film or a polysilicon film;

bonding the metal substrate and the interlayer to the first surface of the semiconductor device after forming the interlayer on the metal substrate, wherein at least a portion of the metal substrate forms an electrical terminal for the semiconductor device and further wherein at least a portion of the metal substrate serves as a mechanical support for the semiconductor substrate; and dicing the semiconductor substrate and the metal substrate to form individual semiconductor chips.

2. The method of claim 1 further comprising removably adhering the semiconductor substrate with the semiconductor device to a carrier, before bonding the semiconductor substrate to the metal substrate.

3. The method of claim 2 further comprising thinning the semiconductor substrate while it is adhered to the carrier, before bonding the semiconductor substrate to the metal substrate.

4. The method of claim 3 wherein the semiconductor device is a power MOSFET and the electrical terminal is a drain.

5. The method of claim 2 further comprising removing the carrier from the semiconductor substrate, after bonding the semiconductor substrate to the metal substrate.

6. The method of claim 5 wherein the semiconductor device is a power MOSFET and the electrical terminal is a drain.

7. The method of claim 2 wherein the semiconductor device is a power MOSFET and the electrical terminal is a drain.

8. The method of claim 1 wherein the semiconductor device is a power MOSFET and the electrical terminal is a drain.

9. The method of claim 1 wherein bonding the semiconductor substrate to the metal substrate and the interlayer comprises bonding the interlayer formed over the metal substrate to the semiconductor substrate.

10. The method of claim 9 wherein the semiconductor device is a power MOSFET and the electrical terminal is a drain.

11. The method of claim 1 further comprising forming a silicide over the interlayer, before bonding the semiconductor substrate to the metal substrate and the interlayer.

12. The method of claim 1 wherein the metal substrate has a CTE of less than about $5\times10^{-6}$ C.-1 at about 200° C.

13. The method of claim 1 wherein the semiconductor device has a thickness of about 100 m or less.

14. The method of claim 1 further comprising forming a metal contact over a second surface of the semiconductor substrate, after bonding the semiconductor substrate to the metal substrate at the first surface of the semiconductor substrate.

15. The method of claim 1 wherein the metal substrate comprises at least one metal selected from the group consisting of Mo, W, Cr and an alloy thereof.

16. The method of claim 1 wherein the metal substrate has a thickness of about 200 m.

17. The method of claim 1 wherein the metal substrate comprises a metal wafer.

18. The method of claim 1 wherein bonding the semiconductor substrate to the metal substrate occurs at less than 300° C.

19. The method of claim 1 wherein the interlayer comprises a polysilicon film.

20. A method of bonding a semiconductor substrate to a metal substrate comprising:
    forming a semiconductor device in a semiconductor substrate, the semiconductor device comprising a first surface;
    obtaining a metal substrate;
    forming an interlayer on the metal substrate, wherein the interlayer comprises an amorphous silicon film or a polysilicon film;
    bonding the metal substrate to the first surface of the semiconductor device, wherein at least a portion of the metal substrate forms an electrical terminal for the semiconductor device and further wherein at least a portion of the metal substrate serves as a mechanical support for the semiconductor substrate, wherein bonding the semiconductor substrate to the metal substrate occurs at a low temperature; and
    dicing the semiconductor substrate and the metal substrate to form individual semiconductor chips.

21. A method of bonding a semiconductor wafer to a metal wafer comprising:
    obtaining a semiconductor wafer comprising a first surface;
    obtaining a metal wafer, wherein the metal wafer is thermally matched to the semiconductor wafer;
    forming an interlayer on the metal wafer, wherein the interlayer comprises an amorphous silicon film or a polysilicon film;
    bonding the metal wafer and the interlayer to the first surface of the semiconductor wafer after forming the interlayer on the metal wafer, wherein an edge of the metal wafer is flush with an edge of the semiconductor wafer after bonding, and further wherein at least a portion of the metal wafer serves as a mechanical support for the semiconductor wafer; and
    dicing the semiconductor wafer and the metal wafer to form individual semiconductor chips, wherein portions of the metal wafer form electrical terminals for at least some of the individual semiconductor chips.

22. The method of claim 21 further comprising removably adhering the semiconductor wafer to a glass carrier, before bonding the semiconductor wafer to the metal wafer and the interlayer.

* * * * *

UNITED STATES PATENT AND TRADEMARK OFFICE
CERTIFICATE OF CORRECTION

| | | |
|---|---|---|
| PATENT NO. | : 7,635,635 B2 | Page 1 of 1 |
| APPLICATION NO. | : 11/400731 | |
| DATED | : December 22, 2009 | |
| INVENTOR(S) | : Hamza Yilmaz et al. | |

It is certified that error appears in the above-identified patent and that said Letters Patent is hereby corrected as shown below:

In column 9, line 37, in claim 13, delete "100 m" and insert -- 100 μm --, therefor.

In column 9, line 47, in Claim 16, delete "200 m." and insert -- 200 μm. --, therefor.

Signed and Sealed this
Thirty-first Day of July, 2012

David J. Kappos
*Director of the United States Patent and Trademark Office*